(12) United States Patent
Shealy et al.

(10) Patent No.: US 9,306,050 B2
(45) Date of Patent: *Apr. 5, 2016

(54) III-V SEMICONDUCTOR STRUCTURES INCLUDING ALUMINUM-SILICON NITRIDE PASSIVATION

(75) Inventors: James R. Shealy, Ithaca, NY (US); Richard Brown, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 338 days.

This patent is subject to a terminal disclaimer.

(21) Appl. No.: 13/380,104

(22) PCT Filed: Jun. 28, 2010

(86) PCT No.: PCT/US2010/040129
§ 371 (c)(1),
(2), (4) Date: Mar. 2, 2012

(87) PCT Pub. No.: WO2010/151855
PCT Pub. Date: Dec. 29, 2010

(65) Prior Publication Data
US 2012/0153301 A1    Jun. 21, 2012

Related U.S. Application Data

(60) Provisional application No. 61/220,978, filed on Jun. 26, 2009.

(51) Int. Cl.
*H01L 29/778*    (2006.01)
*H01L 23/29*    (2006.01)
(Continued)

(52) U.S. Cl.
CPC .......... *H01L 29/7787* (2013.01); *H01L 23/291* (2013.01); *H01L 23/3171* (2013.01); *H01L 29/42316* (2013.01); *H01L 29/66462* (2013.01); *H01L 29/2003* (2013.01); *H01L 2924/0002* (2013.01)

(58) Field of Classification Search
USPC ........................................................... 257/77
See application file for complete search history.

(56) References Cited

U.S. PATENT DOCUMENTS 4,733,283 A * 3/1988 Kuroda ......................... 257/195
4,792,474 A   12/1988 Murakami et al.
(Continued)

FOREIGN PATENT DOCUMENTS

WO    WO0113436 A1    2/2001

OTHER PUBLICATIONS

Robertson, J, "High dielectric constant oxides", European Physical Journal Applied Physics 28, 265-291 (2004).*
(Continued)

*Primary Examiner* — Jarrett Stark
*Assistant Examiner* — Charles N Ausar-El
(74) *Attorney, Agent, or Firm* — William Greener; Alek P. Szecsy; Bond, Schoeneck & King, PLLC

(57) ABSTRACT

A semiconductor structure includes a semiconductor layer that is passivated with an aluminum-silicon nitride layer. When the semiconductor layer in particular comprises a III-V semiconductor material such as a group III nitride semiconductor material or a gallium nitride semiconductor material, the aluminum-silicon nitride material provides a superior passivation in comparison with a silicon nitride material.

22 Claims, 12 Drawing Sheets

(51) Int. Cl.
*H01L 23/31* (2006.01)
*H01L 29/423* (2006.01)
*H01L 29/66* (2006.01)
*H01L 29/20* (2006.01)

(56) References Cited

U.S. PATENT DOCUMENTS

| | | | |
|---|---|---|---|
| 4,957,604 A | 9/1990 | Steininger | |
| 5,112,763 A * | 5/1992 | Taylor et al. | 438/577 |
| 5,990,531 A * | 11/1999 | Taskar et al. | 257/410 |
| 6,180,440 B1 * | 1/2001 | Koganei | 438/167 |
| 6,246,076 B1 * | 6/2001 | Lipkin et al. | 257/77 |
| 6,504,235 B2 * | 1/2003 | Schmitz et al. | 257/649 |
| 7,230,284 B2 * | 6/2007 | Parikh et al. | 257/194 |
| 7,238,560 B2 * | 7/2007 | Sheppard et al. | 438/172 |
| 7,273,822 B2 | 9/2007 | Yeo et al. | |
| 7,332,795 B2 * | 2/2008 | Smith et al. | 257/635 |
| 7,338,826 B2 * | 3/2008 | Mittereder et al. | 438/38 |
| 7,371,649 B2 | 5/2008 | Cheng | |
| 7,449,762 B1 * | 11/2008 | Singh | 257/493 |
| 7,566,918 B2 * | 7/2009 | Wu et al. | 257/194 |
| 7,595,270 B2 | 9/2009 | Elers et al. | |
| 7,632,726 B2 * | 12/2009 | Heying et al. | 438/167 |
| 7,649,215 B2 * | 1/2010 | Beach | 257/194 |
| 7,795,642 B2 * | 9/2010 | Suh et al. | 257/194 |
| 7,851,825 B2 * | 12/2010 | Suh et al. | 257/194 |
| 7,939,391 B2 * | 5/2011 | Suh et al. | 438/172 |
| 7,985,986 B2 * | 7/2011 | Heikman et al. | 257/194 |
| 8,519,438 B2 * | 8/2013 | Mishra et al. | 257/192 |
| 2002/0125573 A1 * | 9/2002 | Cuchiaro et al. | 257/751 |
| 2003/0006426 A1 * | 1/2003 | Kudo | 257/192 |
| 2005/0158977 A1 | 7/2005 | Yeo et al. | |
| 2005/0173728 A1 * | 8/2005 | Saxler | 257/192 |
| 2006/0006415 A1 | 1/2006 | Wu et al. | |
| 2006/0255364 A1 * | 11/2006 | Saxler et al. | 257/192 |
| 2007/0059870 A1 | 3/2007 | Cheng | |
| 2007/0194354 A1 | 8/2007 | Wu et al. | |
| 2007/0252223 A1 | 11/2007 | Lee et al. | |
| 2008/0176390 A1 | 7/2008 | Cheng | |
| 2008/0206974 A1 * | 8/2008 | Simin et al. | 438/586 |
| 2009/0045438 A1 * | 2/2009 | Inoue | H01L 21/318 257/194 |
| 2009/0072240 A1 * | 3/2009 | Suh et al. | 257/76 |
| 2009/0072272 A1 * | 3/2009 | Suh et al. | 257/194 |
| 2009/0146185 A1 * | 6/2009 | Suh et al. | 257/194 |
| 2009/0148985 A1 * | 6/2009 | Heying et al. | 438/142 |
| 2010/0109098 A1 | 5/2010 | Lin et al. | |
| 2011/0057232 A1 * | 3/2011 | Sheppard et al. | 257/194 |
| 2013/0153963 A1 * | 6/2013 | Shealy | H01L 29/155 257/192 |

OTHER PUBLICATIONS

Harvard et al, "Performance of AlGaN/GaN High-Electron Mobility Transistors With AlSiN Passivation", IEEE Transactions on Electron Devices, vol. 58, No. 1, Jan. 2011, pp. 87-94.*
Renping et al, "Fabrication and Characterization of high performance AlGaN/GaN HEMTs on sapphire with silicon nitride passivation", Journal of Semiconductors, vol. 32, no. 6, Jun. 2011.*
Raytheon Technology Today 2007 Issue 4; Lee Ann Sousa, Managing Editor.*
Hwang et al, "Effects of a molecular beam epitaxy grown AlN passivation layer on AlGaN/GaN heterojunction field effect transistors", Solid-State Electroninc 48 (2004) 363-366.*
Tilak et al, "Influence of Barrier Thickness on the High-Power Performance of AlGaN/GaN HEMTs" IEEE Electron Device Letters vol. 22, No. 11 Nov. 2001, pp. 504-506.*
Kim et al, "Thickness Dependent Dielectric Strength of a Low-permittivity Dielectric Film", IEEE Transactions on Dielectric and Electrical Insulation, vol. 8 No. 2, Apr. 2001, pp. 248-252.*
"The General Properties of Si, Ge, SiGe, SiO2 and Si3N4", Virginia Semiconductor, 1501 Powhatten Street, Fredericksburg, VA 22401-4647 USA, www.virginiasemi.com, tech@virginiasemi.com, Jun. 2002.*
Ye et al, "GaAs MOSFET With Oxide Gate Dielectric Grown by Atomic Layer Deposition", IEEE Electron Device Letters, vol. 24, No. 4, Apr. 2003, 209-211.*
Brown et al.; AlxSiyNz Passivated AlGaN/GaN High Electron Mobility Transistors; 978-1-4244-3527-2/09 2009 IEEE; 153-154.
Cussac, Yolaine; International Preliminary Report on Patentability and Written Opinion; The International Bureau of WIPO.

* cited by examiner $$\sigma_n = \frac{\sigma_{p_1} - \sigma_{p_2} - C_B \psi - C_2 \phi + \frac{C_B}{C_{in}}(\sigma_T - \sigma_{p1}) - C_B\left(\frac{qN_{in}}{2\varepsilon_{in}} t_{in}^2\right)}{1 + C_B \frac{\pi \hbar^2}{q^2 m^*}} \quad (1)$$

WHERE $\quad \psi = \phi_B - \Delta E_C - \Delta E_C^{in}$ $$c_{in} = \frac{\varepsilon_{in}}{t_{in}}$$

$$c_2 = \frac{\varepsilon_{GaN}}{t_{GaN}}$$

$$c_B = \left(\frac{1}{c_{in}} + \frac{t_{AlGaN}}{\varepsilon_{AlGaN}}\right)^{-1}$$

FIG. 2A

III-V SEMICONDUCTOR STRUCTURES INCLUDING ALUMINUM-SILICON NITRIDE PASSIVATION

CROSS-REFERENCE TO RELATED APPLICATIONS

The instant application is a US national stage filing from, and claims priority to, PCT Application Serial Number PCT/US2010/040129 filed 10 Jun. 2010, which claims priority from U.S. Provisional Application Ser. No. 61/220,278, filed 26 Jun. 2009. This application also relates to PCT Application Serial Number US10/40136 entitled Chemical Vapor Deposition Process for Aluminum Silicon Nitride, filed on an even date herewith, the contents of which are incorporated herein by reference completely in its entirety. This application also relates to PCT Application Serial Number US10/40137 entitled Method for Forming III-V Semiconductor Structures Including Aluminum-Silicon Nitride Passivation, filed on an even date herewith, the contents of which are incorporated herein by reference completely in its entirety.

U.S. GOVERNMENT SPONSORSHIP

The invention was made with government support under Grant No. N00014-03-1-0963 from the Office of Naval Research. The Government has certain rights in the invention.

BACKGROUND

1. Field of the Invention

The invention relates generally to III-V based semiconductor structures and semiconductor devices. More particularly, the invention relates to dielectric passivation within III-V based semiconductor structures and semiconductor devices.

2. Description of the Related Art

III-V based semiconductor structures and semiconductor devices often provide superior performance in certain applications in comparison with silicon based semiconductor structures and semiconductor devices. For example, gallium arsenide III-V semiconductor structures and semiconductor devices are particularly common within microwave applications.

In addition, group III nitride based semiconductor structures and semiconductor devices, and in particular group III nitride transistors, are desirable for high power electrical circuit applications since group III nitride transistors are capable of carrying a large current (i.e., greater than 1.5 amps/mm normalized to gate periphery) at a high operating electric field strength (i.e., greater than several megavolts/cm).

Group III nitride transistors comprise as an active semiconductor material at least one group III elemental nitride. Since the common group III elemental nitrides include aluminum, indium and gallium nitrides, several binary, ternary and quaternary compositions exist for group III nitride transistors.

Commonly, a group III nitride transistor comprises a substrate over which is successively layered at least two group III nitride material layers having different bandgap characteristics. A buffer layer is located closer to the substrate and a barrier layer is located upon the buffer layer and generally has a wider bandgap. Due to the difference in bandgaps a 2 dimensional electron gas (2DEG) is induced at the interface of the buffer layer and the barrier layer. The two dimensional electron gas typically is highly localized near the heterojunction interface, but largely within the buffer layer that has a smaller bandgap.

While III-V transistors, including group III nitride transistors, provide many performance advantages, III-V transistors are nonetheless not entirely without problems. In that regard, III-V transistors, like many other transistors, are subject to improvement in operating performance.

Since III-V transistors are likely to remain popular within several applications where the enhanced operating characteristics of III-V transistors are primary considerations, desirable are additional III-V transistors, and methods for fabricating the III-V transistors, with enhanced performance.

SUMMARY

The invention provides, in-part III-V semiconductor structures and methods for fabricating the III-V semiconductor structures. Each of the foregoing III-V semiconductor structures and related methods utilizes an aluminum-silicon nitride layer located and formed upon at least a portion of a III-V semiconductor layer surface within the III-V semiconductor structure. The III-V semiconductor structure may include a group III nitride transistor structure, such as but not limited to a high electron mobility transistor (HEMT) structure. The III-V semiconductor structure may alternatively include a gallium arsenide transistor structures.

Bu locating and forming the aluminum-silicon nitride layer upon at least the portion of the III-V semiconductor layer surface within III-V semiconductor structure, improved operating characteristics are realized within a III-V semiconductor device that comprises the III-V semiconductor layer, in comparison with a III-V semiconductor structure that uses a silicon nitride layer in the alternative of the aluminum-silicon nitride layer as a passivation layer.

While not necessarily being bound by any theory of operation of the invention, it is believed that the presence of the aluminum-silicon nitride layer, rather than the silicon nitride layer, provides for superior passivation of the III-V semiconductor surface due to a higher bandgap and a lower permittivity in comparison with silicon nitride.

In that regard, FIG. 1 shows an energy band diagram for the AlSiN dielectric deposited on an AlGaN/GaN HEMT structure (Ga face) in accordance with the invention.

To be consistent with experimental observations a fixed volumetric negative charge is introduced (denoted as Nin) within the AlSiN dielectric in addition to a fixed positive interface charge (denoted as sigma_T). For LPCVD SiN films, the interface charge is equal and opposite to the polarization charge present on the AlGaN surface (denoted as sigma_pl) which effectively eliminates the surface depletion of channel electron charge (denoted as sigma_n) for reasonably thick dielectric coatings (typically greater than 250 angstroms). For AlSiN films the fixed positive interface charge is reduced by as much as 50%, and additional negative charge is within the dielectric, both of which re-establishes the surface depletion with the dielectric present on the AlGaN surface (as opposed to the SiN coated HEMT structure) thereby reducing the channel charge in regions under the AlSiN dielectric.

Using this band structure, and simple quantum mechanics and electrostatics, the equations of FIG. 2A may be used to predict the electron sheet charge present at the AlGaN/GaN heterojunction with AlSiN passivation present.

Within the equations, epsilon_in, epsilon_GaN, and epsilon_AlGaN are the permittivities of the AlSiN insulator, the GaN buffer layer, and the AlGaN barrier layer, respectively. The thickness of the AlSiN insulator, the GaN buffer layer, and the AlGaN barrier layer are given as t_in, t_GaN, and t_AlGaN, respectively. The potential phi_B is the surface barrier height, and the potentials Delta E_C and Delta_E_c^ in are the conduction band offsets for GaN/AlGaN interface and the AlGaN/AlSiN interface respectively.

The AlN molar fraction in the dielectric determines how much distributed negative charge and fixed positive charge is introduced. Controlling the composition of the AlSiN and its thickness allows for the engineering of the channel charge in un-gated portions of the transistor channel. This in turn allows the device designer to significantly reduce the longitudinal electric field strength on both the source and drain ends of the gate for a given set of bias conditions. The sharp reduction in these fields strengths can minimize or eliminate undesirable characteristics of the device including non-linear increase is the device source resistance with drain current, and DC to RF dispersion which reduces the PAE of the transistor amplifier as the drain bias is increased. Devices were fabricated with 10 atomic % Al within the AlSIN had volumetric negative charge densities of roughly 1E18 cm-3 and a positive interface charge density which was 90% as large as the AlGaN polarization surface charge density as shown in FIG. 2B, where the measured data for SiN passivation is shown as the dark squares and the measured data for AlSIN is shown as the open circles. The smooth curves (i.e., reference numeral 201 for SiN passivation and reference numeral 202 for AlSiN passivation) are produced using equation (1) where sigma_T and N_in are adjusted to best fit the measured data.

A particular semiconductor structure in accordance with the invention includes a semiconductor layer located over a substrate. This particular semiconductor structure also includes a passivation layer located upon the semiconductor layer, wherein the passivation layer comprises a passivation material having a bandgap from about 4.5 eV to about 6 eV and a permittivity from about 6×10^-11 F/m to about 8×10^-11 F/m, at a frequency from about 1 to about 100 GHz.

Another particular semiconductor structure in accordance with the invention includes at least one III-V semiconductor layer located over a substrate. This particular semiconductor structure also includes a passivation layer located upon the III-V semiconductor layer. The passivation layer comprises an aluminum-silicon nitride material.

A particular high electron mobility transistor (HEMT) structure in accordance with the invention includes a buffer layer comprising a first group III nitride semiconductor material located over a substrate. This particular high electron mobility transistor also includes a barrier layer comprising a second group III nitride semiconductor material located upon the buffer layer. This particular high electron mobility transistor also includes a source contact and a drain contact located at least in-part contacting separated portions of the barrier layer. This particular high electron mobility transistor also includes a first dielectric passivation layer located upon at least a portion of the barrier layer interposed between the source contact and the drain contact. The first dielectric passivation layer comprises an aluminum-silicon nitride material. This particular high electron mobility transistor also includes a gate located interposed between the source contact and the drain contact, and contacting the barrier layer.

A particular gallium arsenide transistor structure in accordance with the invention includes an undoped gallium arsenide buffer layer located over a substrate. The particular gallium arsenide transistor structure also includes a conducting gallium arsenide layer located upon the undoped gallium arsenide layer. The particular gallium arsenide transistor structure also includes a source contact and a drain contact located upon separated portions of the conducting gallium arsenide layer. The particular gallium arsenide transistor structure also includes a first dielectric passivation layer located upon at least a portion of the conducting gallium arsenide layer and interposed between the source contact and the drain contact. The first dielectric passivation layer comprises an aluminum-silicon nitride material. The particular gallium arsenide transistor structure also includes a gate located interposed between the source contact and the drain contact, and contacting the conducting gallium arsenide layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein:

FIG. 2A shows a series of equations that may be used for determining surface charge characteristics for an aluminum-silicon nitride layer in accordance with the invention, in comparison with a silicon nitride layer.

DESCRIPTION OF THE PREFERRED EMBODIMENTS

Figure 1:
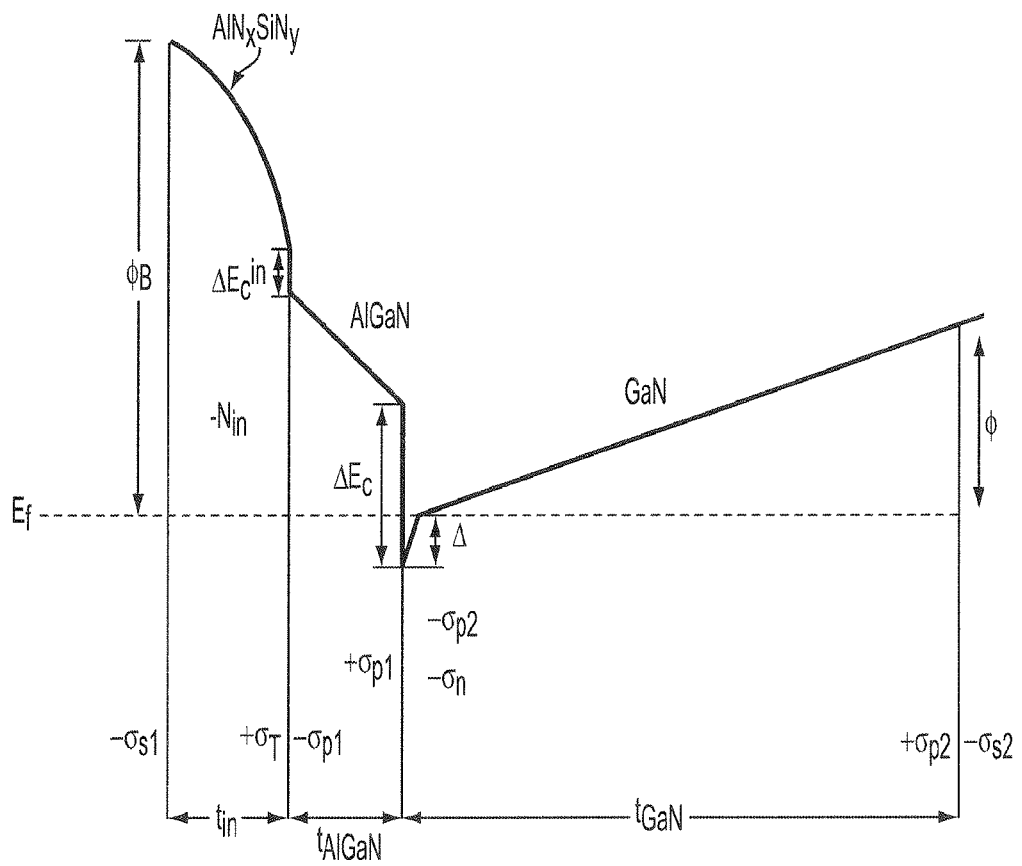
FIG. 1 shows a bandgap diagram for an aluminum-silicon nitride passivated AlGaN/GaN high electron mobility transistor (HEMT) in accordance with the invention.
Figure 2B:
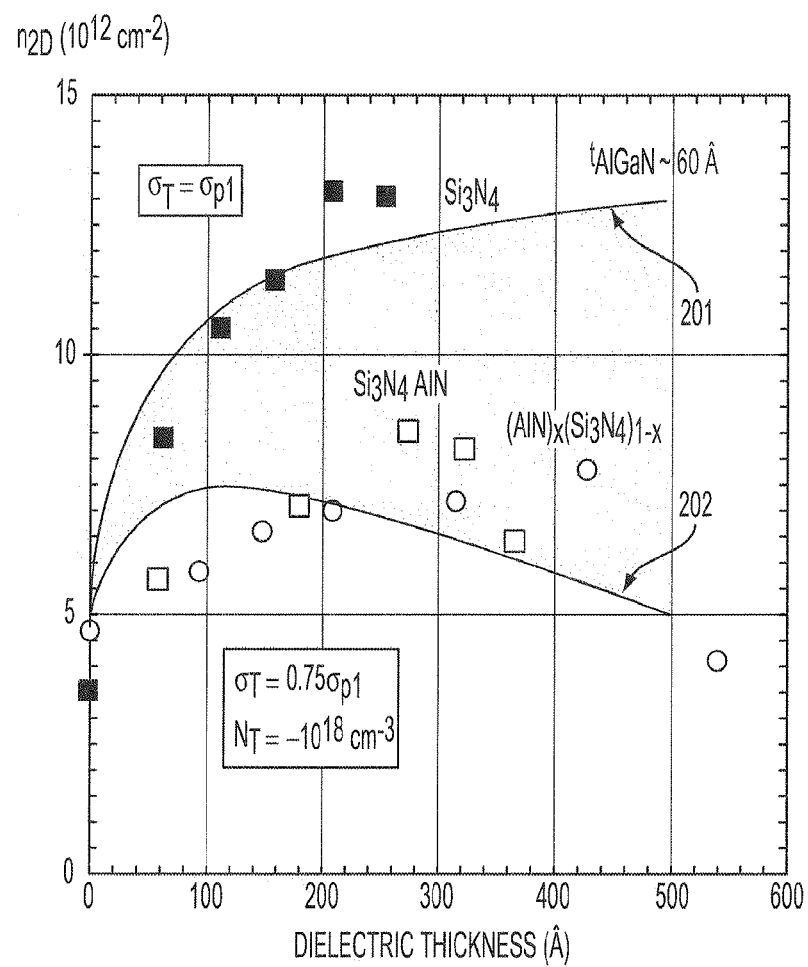
FIG. 2B shows a charge density diagram illustrating surface charge characteristics of aluminum-silicon nitride passivation layers in accordance with the invention, in comparison with silicon nitride passivation layers.

The invention, which includes a plurality of semiconductor structures (i.e., including III-V semiconductor structures) and a related plurality of methods for fabricating the plurality of semiconductor structures, is understood within the context of the description set forth below. The description set forth below is understood within the context of the drawings described above. Since the drawings are intended for illustrative purposes, at least some of the drawings are not necessarily drawn to scale.

While the preferred embodiments illustrate the invention within the context of a group III nitride high electron mobility transistor and a III-V gallium arsenide transistor, the embodiments of the invention are not necessarily intended to be so limited.

Rather, in a broad application, the invention is understood to provide superior performance characteristics for at least III-V semiconductor devices insofar as an aluminum-silicon nitride passivation layer in accordance with the invention is understood to provide a controlled charge depletion of a 2DEG in ungated portions of a channel, in comparison with a silicon nitride passivation which provides no surface depletion of the 2DEG and thus results in a full channel charge in the ungated portions of the channel.

It is anticipated that a passivation material operative within the context of the invention will have: (1) a larger bandgap than silicon nitride; and (2) a lower permittivity than silicon nitride, within a particular microwave frequency range to effect the foregoing results. Thus, the invention broadly considers as candidate passivation dielectric materials those having: (1) a bandgap from about 4.5 eV to about 6.0 eV, more preferably from about 4.75 eV to about 5.5 eV and most preferably from about 5 to about 5.25 eV; and (2) a permittivity from about $6\times10^{-11}$ F/M to about $8\times10^{-11}$ F/m, more preferably from about $6.25\times10^{-11}$ F/m to about $7.75\times10^{-11}$ F/m and most preferably from about $6.5\times10^{-11}$ F/m to about $7.5\times10^{-11}$ F/m, at a microwave frequency from about 1 to about 100 GHz.

III-V semiconductor layers that may be passivated with an aluminum-silicon nitride layer in accordance with the invention include, but are not limited to: (1) gallium nitride based semiconductor layers including but not limited to aluminum gallium nitride (AlGaN), gallium nitride (GaN), aluminum indium nitride (AlInN), and gallium indium nitride (GaInN) layers; (2) gallium arsenide based semiconductor layers including but not limited to aluminum gallium arsenide (AlGaAs), gallium arsenide (GaAs), aluminum gallium indium phosphide (AlGaInP), gallium indium phosphide (GaInP) layers; (3) indium-phosphide-based semiconductor layers including aluminum indium arsenide (AlInAs), gallium indium arsenide (GaInAs), indium phosphide (InP) layers; and (4) gallium-phosphide-based semiconductor layers including but not limited to aluminum gallium phosphide (AlGaP), gallium indium phosphide (GaInP) and gallium phosphide (GaP) layers. Also considered are pseudomorphic or metamorphic III-V semiconductor compositions in accordance with the above layers.

Figure 3A:
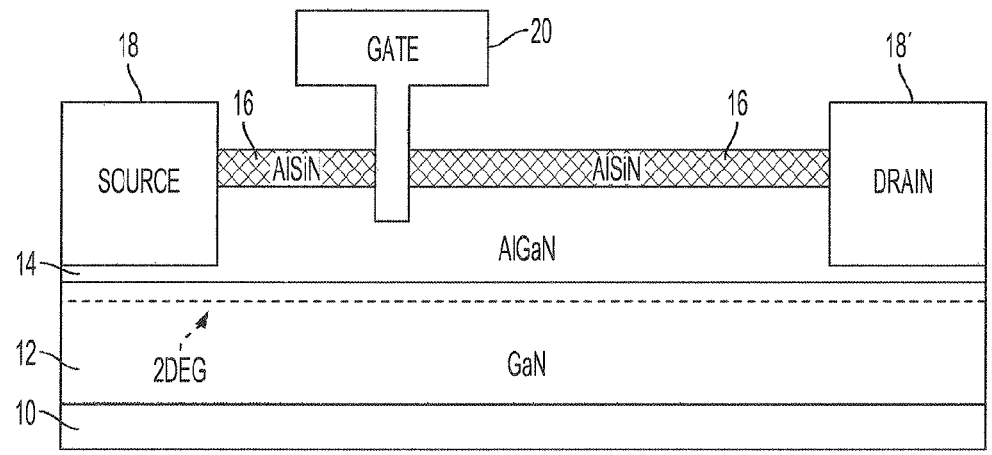
FIG. 3A, FIG. 3B and FIG. 3C show a series of schematic cross-sectional diagrams illustrating three different high electron mobility transistor structures that may be fabricated in accordance with three particular embodiments of the invention.

FIG. 3A shows a schematic cross-sectional diagram of a high electron mobility transistor (HEMT) in accordance with a particular embodiment of the invention that comprises a first embodiment of the invention.

FIG. 3A shows a substrate 10 upon which is located and formed a buffer layer 12 (i.e., illustrated as gallium nitride material, but not intended to be so limited). A barrier layer 14 is located and formed upon the buffer layer 12 (i.e., illustrated as a gallium aluminum nitride material but not intended to be so limited). An aluminum-silicon nitride layer 16 is located and formed upon the barrier layer 14.

FIG. 3A also shows a source contact 18 and a drain contact 18' located and formed embedded within separated portions of the barrier layer 16 and laterally abutted by the aluminum-silicon nitride layer 16. FIG. 3A finally shows a gate 20 located and formed laterally abutted by the aluminum-silicon nitride layer 16 while penetrating through the aluminum-silicon nitride layer 16 and partially into the barrier layer 14 (i.e., the gate 20 comprises a recessed gate).

Each of the layers and structures that comprise the high electron mobility transistor whose schematic cross-sectional diagram is illustrated in FIG. 3A may comprise materials and have dimensions that are otherwise generally conventional in the group III nitride high electron mobility transistor design and fabrication art.

For example, the substrate 10 may comprise any of several substrate materials that are generally conventional in the group III nitride high electron mobility transistor design and fabrication art. Such substrate materials may include, but are not necessarily limited to silicon (Si), silicon carbide (SiC), sapphire (Al2O3), gallium nitride (GaN), aluminum nitride (AlN), germanium (Ge), gallium arsenide (GaAs), gallium phosphide (GaP), and indium phosphide (InP) substrate materials. Alternatively, any single crystal semiconductor host substrate may also be used for the substrate 10.

An insulating buffer layer located and formed on the substrate 10 may also be included as a surface portion of the substrate 10. This insulating buffer layer may include a thin wide bandgap substrate isolation material (i.e., AlN for GaN-based devices and AlGaInP for GaAs based devices, as examples).

Each of the buffer layer 12 and the barrier layer 14 comprises a group III nitride semiconductor material, albeit with a different bandgap. Generally, a bandgap of the buffer layer 12 is lower than a bandgap of the barrier layer 14. Thus, several choices exist for a group III nitride semiconductor material for the buffer layer 12 and the barrier layer 14. Commonly, the buffer layer 12 comprises a gallium nitride group III nitride semiconductor material that has a thickness from about 100 to about 3000 nanometers and the barrier layer 14 comprises an aluminum gallium nitride group III nitride semiconductor material that has a thickness from about 1 to about 100 nanometers.

The source contact 18 and the drain contact 18' desirably provide ohmic contact to at least the barrier layer 14, and as a result of that consideration the source contact 18 and the drain contact typically comprise a metal material or a stack of metal materials. Typically and preferably, each of the source contact 18 and the drain contact 18' comprises a metallization stack that includes in a layered succession tantalum, titanium, aluminum, molybdenum and gold. The metallization stack has a thickness that allows for an elevation above the aluminum-silicon nitride layer 16.

Analogously with the source contact 18 and the drain contact 18' the gate 20 also typically comprises a metal material, or a metallization stack, but typically a different metal or metallization stack in comparison with the source contact 18 and the drain contact 18'. While by no means limiting the embodiment, the gate 20 may comprise a successively layered metallization stack including a nickel material upon which is located and formed a gold material.

Finally, FIG. 3A illustrates a two dimensional electron gas (2DEG) region located and formed at the interface of the buffer layer 12 and the barrier layer 14. This 2DEG is a result of the difference in bandgap between the buffer layer 12 and the barrier layer 14, and this two dimensional electron gas 2DEG is integral to operation of the group III nitride high electron mobility transistor whose schematic cross-sectional diagram is illustrated in FIG. 3A.

The instant embodiment and the invention derive from an influence that the aluminum-silicon nitride layer 16 has with respect to operation of the high electron mobility transistor of FIG. 3A.

The aluminum-silicon nitride layer 16 comprises an aluminum-silicon nitride material that has a bandgap from about 4.5 to about 6 eV, more preferably from about 4.75 eV to about 5.5 eV and most preferably from about 5 to about 5.25 eV; and (2) a permittivity from about $6 \times 10^{-11}$ F/m to about $8 \times 10^{-11}$ F/m, more preferably from about $6.25 \times 10^{-11}$ F/m to about $7.75 \times 10^{-11}$ F/m and most preferably from about $6.5 \times 10^{-11}$ F/m to about $7.5 \times 10^{-11}$ F/m, at a microwave frequency from about 1 to about 100 GHz.

The aluminum-silicon nitride layer has an aluminum content from about 0.1 to about 25 atomic percent, a silicon content from about 25 to about 55 atomic percent and a nitrogen content from about 40 to about 60 atomic percent.

The aluminum-silicon nitride layer 16 may be deposited using a low pressure chemical vapor deposition method using dichlorosilane, ammonia and trimethylaluminum as a silicon precursor, a nitrogen precursor and an aluminum precursor. Typical deposition conditions include: (1) a reactor chamber pressure from about 1 to about 3 torr; (2) a substrate temperature from about 500 to about 800 degrees centigrade; (3) a dichlorosilane silicon precursor flow from about 50 to about 200 standard cubic centimeters per minute in a nitrogen carrier gas flow from about 500 to about 20000 standard cubic centimeters per minute; (4) an ammonia nitrogen precursor flow from about 50 to about 2000 standard cubic centimeters per minute in a nitrogen carrier gas flow from about 500 to about 20000 standard cubic centimeters per minute; and (5) a trimethylaluminum aluminum precursor flow from about 1 to about 500 standard cubic centimeters per minute in a nitrogen carrier gas flow from about 10 to about 5000 standard cubic centimeters per minute.

Typically, the aluminum-silicon nitride layer 16 has a thickness from about 2 to about 5000 nanometers.

In order to fabricate the high electron mobility transistor of FIG. 3A, one may simply start with a layered structure including the substrate 10, the buffer layer 12, a precursor to the barrier layer 14 and a precursor to the aluminum-silicon nitride layer 16. This layered group III nitride semiconductor structure may then be patterned in a first photolithographic process step to pattern the precursor to the aluminum-silicon nitride layer 16, and also form source and drain trenches within the barrier layer 14. This first photolithographic method may use a patterning photoresist mask that also serves as a lift off mask when forming the source contact 18 and the drain contact 18'.

The group III nitride semiconductor structure that results from the first photolithographic process step may then be further patterned while using a second photolithographic process step to form the aluminum-silicon nitride layer 16, as well as an aperture within the barrier layer 14 within which the gate 20 is located and formed.

Alternative process sequences are not precluded for fabricating the high electron mobility transistor structure of FIG. 3A.

Figure 3B:
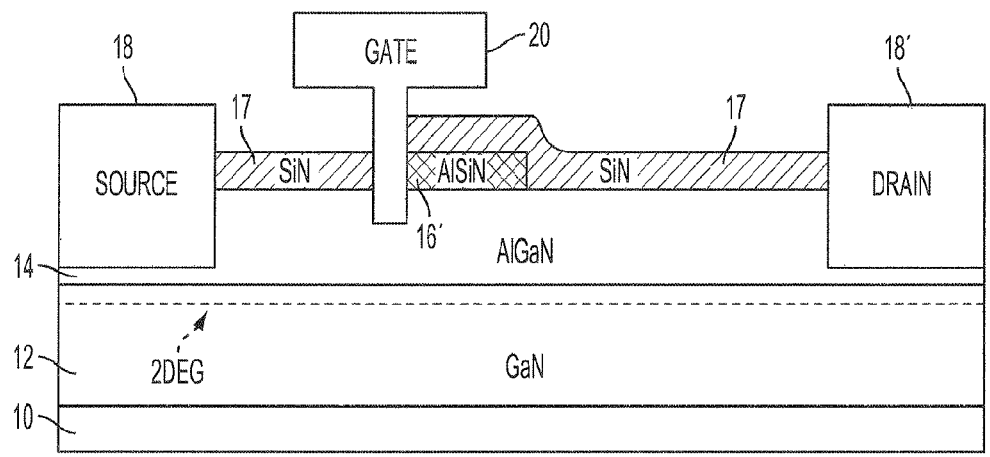

FIG. 3B shows a schematic cross-sectional diagram illustrating a high electron mobility transistor in accordance with an additional embodiment of the invention that comprises a second embodiment of the invention.

The high electron mobility transistor of FIG. 3B corresponds generally with the high electron mobility transistor of FIG. 3A, but differs in a first instance insofar as an aluminum-silicon nitride layer 16' covers only a portion of the barrier layer 14 while abutting the gate 20 (i.e., the aluminum-silicon nitride layer 16' serves as a field plate that may be on either the source contact 18 or the drain contact 18' side of the gate 20), rather than completely covering the portions of the barrier layer 14 interposed between the source contact 18 and the drain contact 18' while abutting the gate 20. Rather, within FIG. 3B a silicon nitride layer 17 covers those exposed portions of the barrier layer 14 while bridging upon a top surface of the aluminum-silicon nitride layer 16' and abutting the gate 20.

The high electron mobility transistor structure of FIG. 3B may be fabricated similarly with the high electron mobility transistor structure of FIG. 3A, but wherein the precursor to the aluminum-silicon nitride layer 16 is further patterned to form the aluminum-silicon nitride layer 16' prior to forming the source contact 18 and the drain contact 18'. A precursor layer to the silicon nitride layer 17 is also formed upon the aluminum-silicon nitride layer 16' prior to forming the source contact 18 and the drain contact 18'.

Figure 3C:
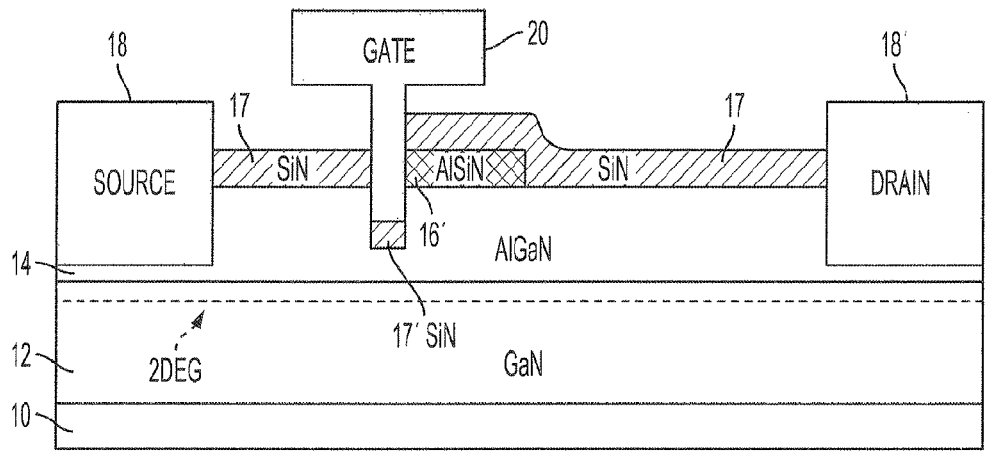

FIG. 3C shows a schematic cross-sectional diagram illustrating a high electron mobility transistor in accordance with an additional embodiment of the invention that comprises a third embodiment of the invention.

The high electron mobility transistor of FIG. 3C corresponds otherwise generally with the high electron mobility transistor of FIG. 3B, but includes a silicon nitride gate dielectric 17' located and formed at the base of the aperture in the barrier layer 14 into which is located and formed the gate 20. Thus, the gate 20 as is illustrated in FIG. 3C has both Schottky characteristics due to sidewall contact of the gate 20 with the barrier layer 14 and metal-insulator-semiconductor characteristics due to the presence of the silicon nitride layer 17' at the base of the aperture within which is located and formed the gate 20.

The high electron mobility transistor whose schematic cross-sectional diagram is illustrated in FIG. 3C may be fabricated similarly with the high electron mobility transistor whose schematic cross-sectional diagram is illustrated in FIG. 3B, but wherein additional processing is provided after forming the aperture within the barrier layer 14 into which is located and formed the gate 20 to deposit the silicon nitride layer 17', prior to locating and forming the gate 20 into that aperture.

Figure 4A:
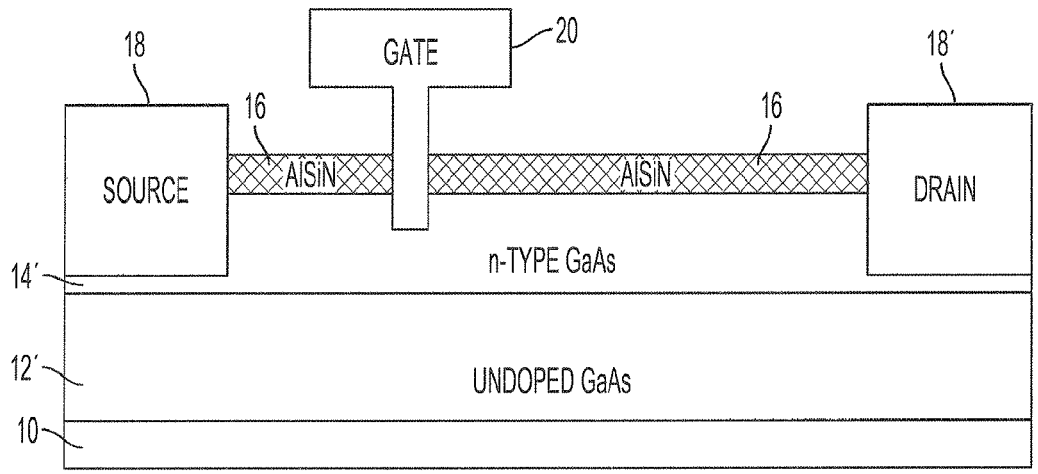
FIG. 4A and FIG. 4B show a pair of schematic cross-sectional diagrams illustrating two different gallium arsenide transistor structures that may be fabricated in accordance with another two particular embodiments of the invention.

FIG. 4A shows a schematic cross-sectional diagram of a III-V semiconductor structure illustrating a gallium arsenide transistor in accordance with yet another embodiment that comprises a fourth embodiment of the invention.

As is illustrated within the schematic cross-sectional diagram of FIG. 4A, the basic structural characteristics of the gallium arsenide transistor structure correlate generally with the basic structural characteristics of the high electron mobility transistor of FIG. 3A, but the buffer layer 12 and the barrier layer 14 as illustrated in FIG. 3A are now replaced by an undoped gallium arsenide layer 12' and a doped conductive gallium arsenide layer 14'. Although FIG. 4A illustrates an n doped gallium arsenide layer 14', this particular embodiment, and the following fifth embodiment, are also operative with either polarity of a conductive gallium arsenide layer.

Figure 4B:
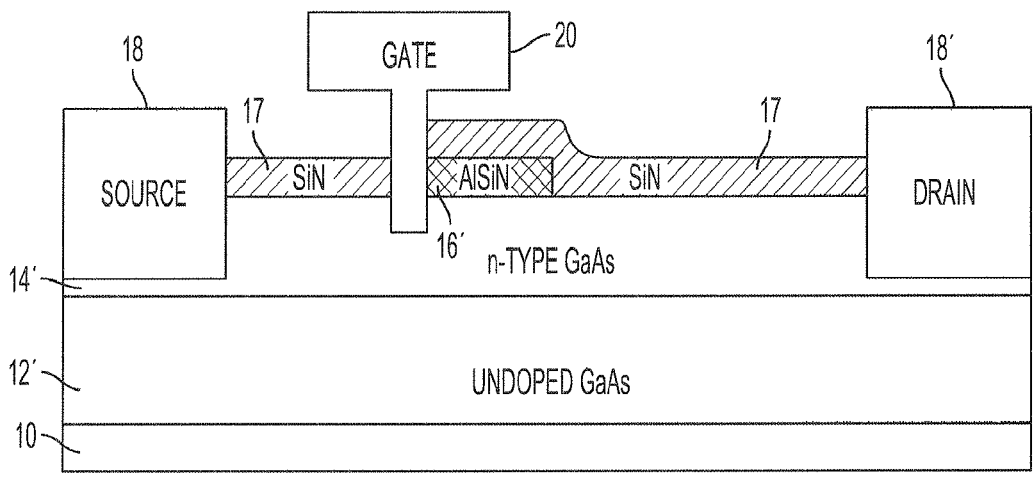

FIG. 4B shows a schematic cross-sectional diagram of a III-V semiconductor structure illustrating a gallium arsenide transistor in accordance with a fifth embodiment of the invention.

FIG. 4B shows a III-V gallium arsenide transistor structure that corresponds with the high electron mobility transistor of FIG. 3B, but similarly with the III-V gallium arsenide transistor structure of FIG. 4A in accordance with the fourth embodiment, the buffer layer 12 and the barrier layer 14 as illustrated within FIG. 3B are now replaced by an undoped gallium arsenide layer 12' and a conductive gallium arsenide layer 14'.

Processing for fabricating the gallium arsenide transistor structures of FIG. 4A and FIG. 4B parallels the processing sequences for the high electron mobility transistors of FIG. 3A and FIG. 3B.

As is illustrated within the schematic cross-sectional diagrams of FIG. 3A to FIG. 4B, an aluminum-silicon nitride passivating layer 16/16' in accordance with the embodiments is located and formed as a planar layer absent intrusion into the aperture within the barrier layer 14 (for a group III nitride transistor) or the conductive gallium arsenide layer 14' (for a gallium arsenide transistor) into which is located and formed the gate 20. The aluminum-silicon nitride passivating layer 16/16' within the embodiments is thus not located and formed beneath a lower most portion of the gate 20 that is recessed within the barrier layer 14 (within FIG. 3A to FIG. 3C) or the conducting gallium arsenide layer 14' (within FIG. 4A and FIG. 4B).

Figure 5A:
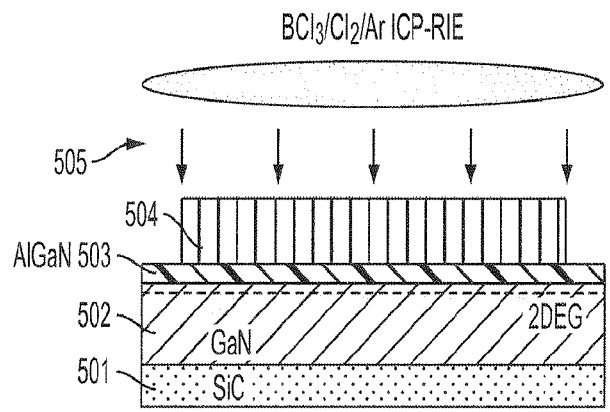
FIG. 5A to FIG. 5P show a series of schematic cross-sectional diagrams illustrating progressive stages in fabricating a high electron mobility transistor in accordance with yet another particular embodiment of the invention.
Figure 5B:
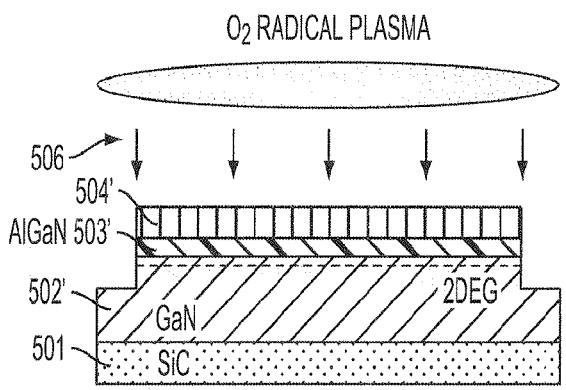
Figure 5C:
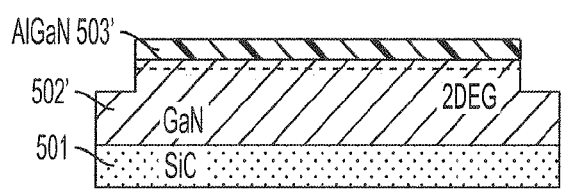
Figure 5D:
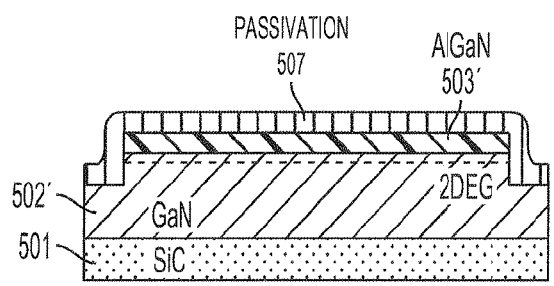
Figures 5E, 5F:
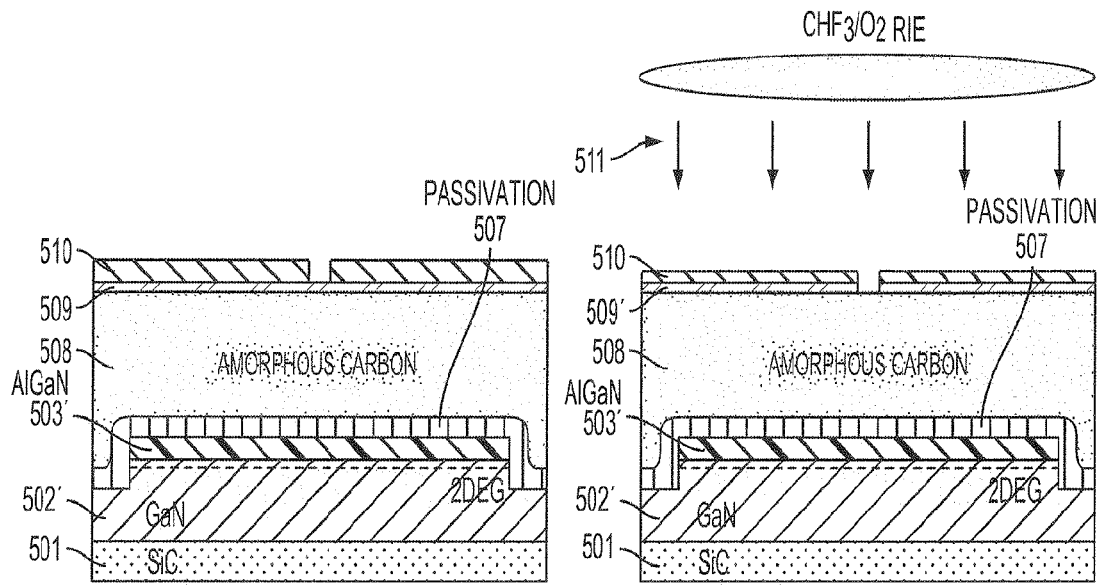
Figures 5G, 5H:
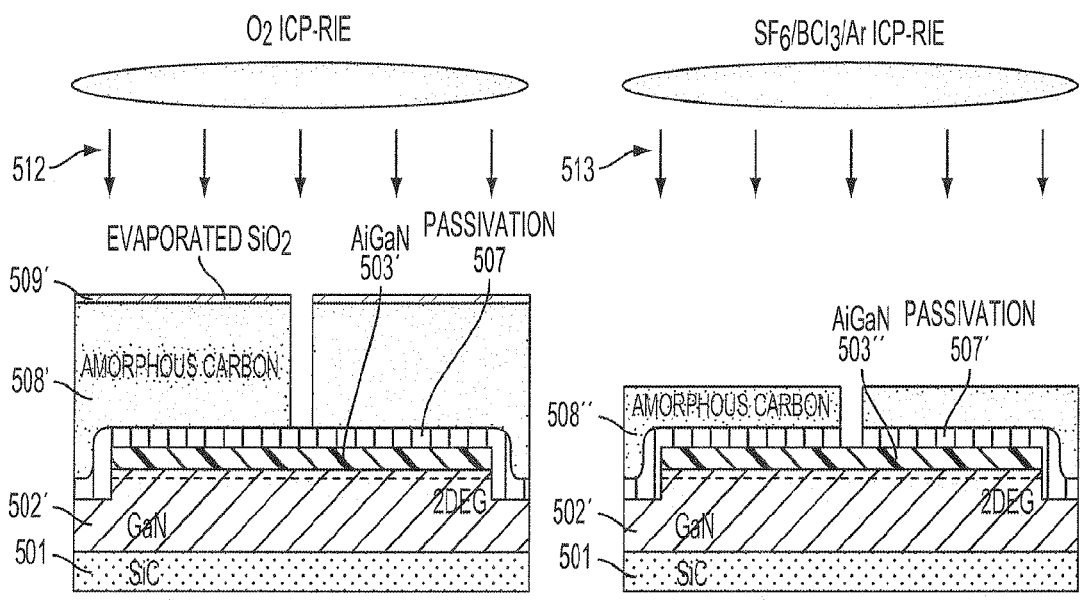
Figure 5I:
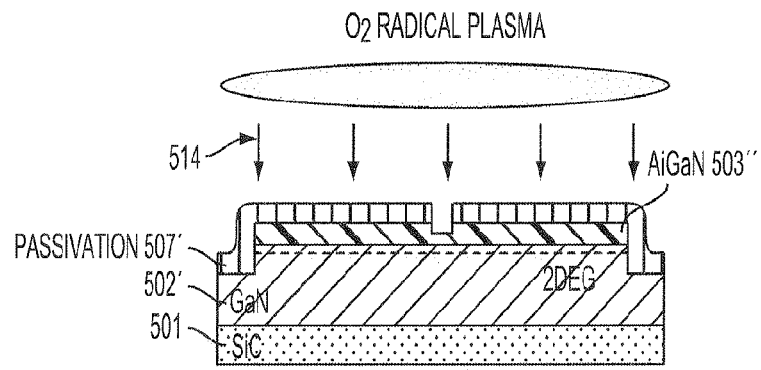
Figure 5J:
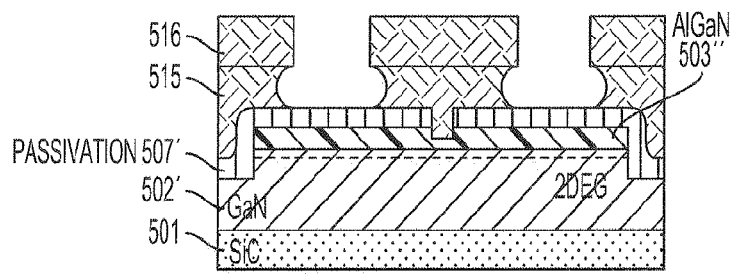
Figure 5K:
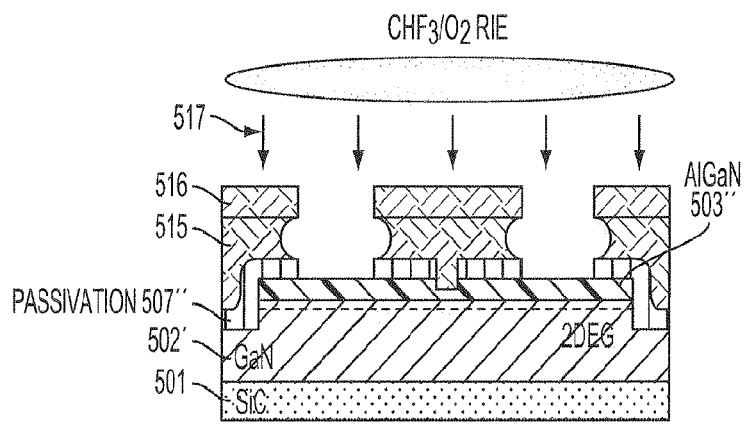
Figure 5L:
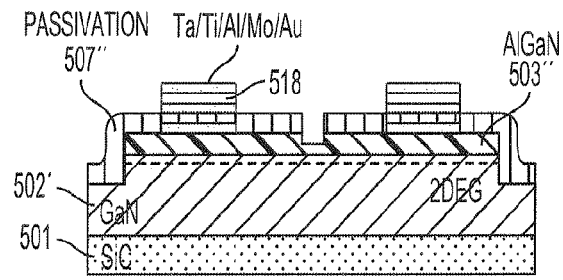
Figure 5M:
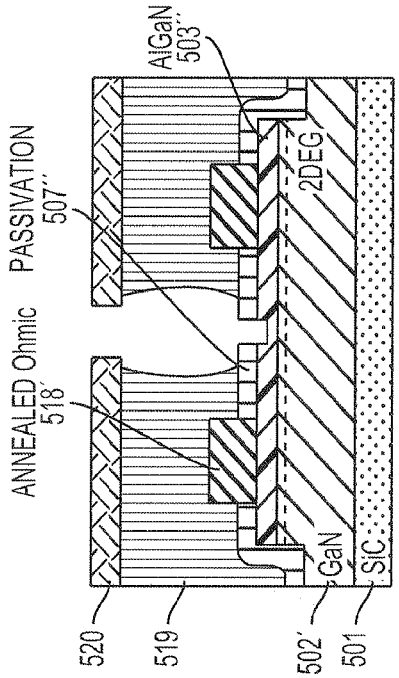
Figure 5N:
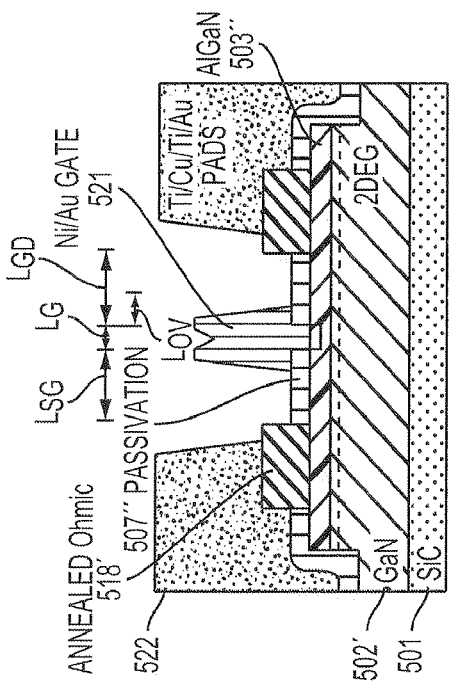
Figure 5O:
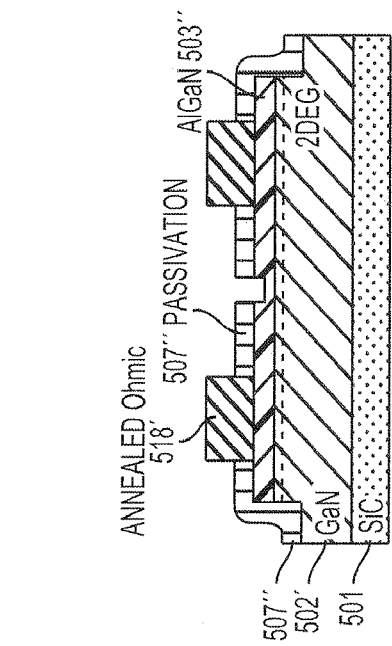
Figure 5P:
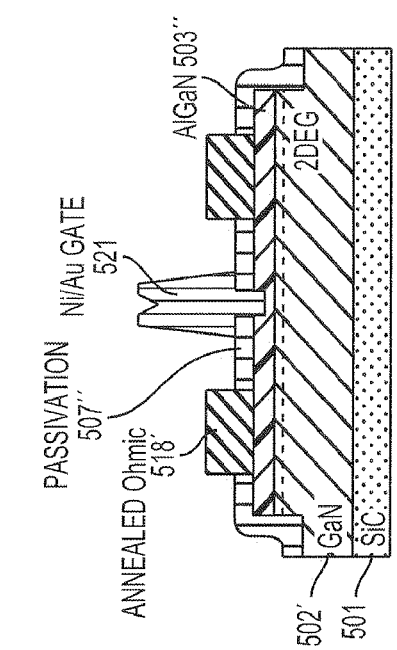

FIG. 5A to FIG. 5P show a series of schematic cross-sectional diagrams illustrating the results of progressive process stages in fabricating a high electron mobility transistor in accordance with a particular process sequence in accordance with the invention.

FIG. 5A shows a substrate 501. A buffer layer 502 is located and formed upon the substrate 501. A barrier layer 503 is located and formed upon the buffer layer 502. A mesa mask 504 is located and formed upon the barrier layer 503.

The substrate 501, the buffer layer 502 and the barrier layer 503 correspond generally with the substrate 10, the buffer layer 12 and the barrier layer 14 within the high electron mobility transistors of FIG. 3A to FIG. 3C.

The mesa mask 504 may comprise, but is not necessarily limited to a hard mask material, a resist mask material or a combination of a hard mask material and a resist mask material.

FIG. 5A in particular illustrates the mesa mask 504 being used as an etch mask with respect to etching a mesa within the layered stack comprising the buffer layer 502 and the barrier layer 503 located and formed over the substrate 501 of FIG. 5A, while using an inductively coupled plasma reactive ion etch 505 comprising boron trichloride, chlorine and argon gases as reactive species. Generally conventional conditions may be used for the inductively coupled reactive ion etch 505.

FIG. 5B shows a mesa that comprises a buffer layer 502' and a barrier layer 503' that are etched from the corresponding buffer layer 502 and barrier layer 503 that are illustrated in FIG. 5A. FIG. 5B also shows the results of stripping part of the mesa mask 504 that is illustrated in FIG. 5A to yield an intermediate thickness mesa mask 504' while using an oxygen containing plasma 506. FIG. 5C shows the resulting high electron mobility transistor structure after having completely stripped the mesa mask 504.

FIG. 5D shows an aluminum-silicon nitride layer 507 located and formed upon the high electron mobility transistor structure of FIG. 5C. The aluminum-silicon nitride layer 507 corresponds generally with the aluminum-silicon nitride layer 16/16' that is illustrated within the high electron mobility transistor whose schematic cross-sectional diagram is illustrated in FIG. 3A to FIG. 3C.

FIG. 5E shows a planarizing layer 508 located and formed upon the aluminum-silicon nitride layer 507, A hard mask 509 is located and formed upon the planarizing layer 508 and an aperture mask 510 is located and formed upon the hard mask 509. The planarizing layer 508 typically comprises an amorphous carbon material. The hard mask 509 typically comprises a dielectric hard mask material. The aperture mask 510 typically comprises a resist material, although alternative materials may be used for the planarizing layer 508, the hard mask 509 and the aperture mask 510. The foregoing amorphous carbon material, dielectric hard mask material and resist materials are generally conventional, and formed using generally conventional methods and thicknesses.

FIG. 5F shows transfer of an aperture pattern from the aperture mask 510 into a hard mask 509', while using a trifluoromethane and oxygen based reactive ion etch plasma 511. The trifluoromethane and oxygen based reactive ion etch plasma 511 may employ otherwise generally conventional etching conditions and etchant parameters.

FIG. 5G shows further stripping of the aperture mask 510 from the hard mask 509' and extension of the aperture through a planarizing layer 508' derived from the planarizing layer 508 to reach the aluminum-silicon nitride layer 507, while using an oxygen reactive ion etch plasma 512. This oxygen reactive ion etch plasma 512 is generally similar to prior oxygen reactive ion etch plasmas as illustrated within the instant embodiment (see, e.g. FIG. 4B). FIG. 5H shows in an aggregate: (1) stripping of the hard mask 509'; (2) etching of the planarizing layer 508' to form a planarizing layer 508''; (3) etching of the aluminum-silicon nitride layer 507 to form an aluminum-silicon nitride layer 507'; and (4) an over etching into the barrier layer 503' to form a barrier layer 503'' that includes an aperture (i.e., a gate aperture), while using a sulfur hexafluoride, boron trichloride and argon based reactive ion etch plasma 513. This particular sulfur hexafluoride, boron trichloride and argon based reactive ion etch plasma 513 may employ otherwise generally conventional process conditions and parameters.

FIG. 5I shows the results of completely stripping the remaining planarizing layer 508'' while using an oxygen containing plasma 514 to provide an intermediate high electron mobility transistor structure.

FIG. 5J shows a bilayer etch mask and source/drain contact liftoff mask layer located and formed upon the high electron mobility structure of FIG. 5I. The bilayer mask structure includes a lower layer 515 that is laterally isotropically enlarged and an upper layer 516 of narrower and well controlled linewidth. The lower layer 515 may often comprise an organic or inorganic planarizing material, while the upper layer 516 may typically comprise a resist material. Isotropic etching may provide the isotropic enlargement of the lower layer 515.

FIG. 5K shows an etching of the aluminum-silicon nitride layer 507' to form an aluminum-silicon nitride layer 507'' while using the foregoing bilayer mask as an etch mask, in conjunction with a trifluoromethane and oxygen based reactive ion etch plasma 517. The foregoing etching leaves exposed portions of the barrier layer 503''.

FIG. 5L shows source and drain contact stacks 518 located and formed upon separated portions of the barrier layer 503'' that were exposed during the etch process step illustrated in FIG. 5K. The source and drain contact stacks 518 are formed while using the bilayer mask 515/516 as a liftoff mask. FIG. 5L also shows the results of stripping the bilayer mask 515/516 after forming the source and drain contact stacks 518.

FIG. 5M shows a similar high electron mobility transistor structure of FIG. 5L, but wherein the source and drain contact stacks 518 are thermally annealed to form source and drain contact stacks 518'. Any of several thermal annealing methods may be used, including but not limited to furnace annealing methods and rapid thermal annealing methods.

FIG. 5N shows a bilayer gate liftoff mask comprising an underlayer 519 and an overlayer 520 that is generally similar to the source and drain contact mask that comprises the underlayer 515 and the overlayer 516 that is illustrated in FIG. 5J.

FIG. 5O illustrates a gate 521 located and formed into the gate aperture within the barrier layer 503", and spanning on a top surface of the aluminum-silicon nitride layer 507". The gate 521 as illustrated in FIG. 5O is formed while using the bilayer gate liftoff mask 519/520 as a lift off mask, as is otherwise generally conventional, and otherwise also similar with the source and drain contact stacks 518.

Finally, FIG. 5P shows source and drain contact pads 522 located and formed partially encapsulating the source and drain contact stacks 518. Although not specifically illustrated within the schematic cross-sectional diagram of FIG. 5P, the source and drain contact pads 522 are similarly also formed using a lift off process. FIG. 5P also shows dimensions with respect to the gate 521 designates as L, where s is source, d is drain, g I gate and ol is overlap.

FIG. 5A to FIG. 5P show a series of schematic cross-sectional diagrams illustrating results of progressive process steps in fabricating an aluminum-gallium nitride/gallium nitride high electron mobility transistor in accordance with a particular methodology in accordance with the invention. This particular methodology uses several liftoff process steps for forming the gate 521, as well as source and drain contact stacks 518 and source and drain contact pads 522.

Experimental

In order to illustrate the value of the invention, sample transistors in accordance with the HEMT structure of FIG. 3A were fabricated using otherwise equivalent or identical processing sequences and dimensions, but using either an aluminum-silicon nitride layer 16 passivation as illustrated in FIG. 3A, or alternatively a silicon nitride layer passivation.

To that end, thin films (30 nm) of AlxSiyNz and SiyNz were used to passivate devices (fabricated side-by-side) and their performance was compared in both small signal and large signal measurement environments. Examination of MIS structures with each dielectric by capacitance-voltage measurements revealed the AlxSiyNz provides a net negative fixed charge density allowing controlled depletion of the two dimensional electron gas (2DEG) in ungated regions of the channel. This is in contrast to SiyNz passivation where the surface depletion of the 2DEG is almost completely removed, which results in the full channel charge existing in the ungated portions of the channel. Reducing the charge in the ungated portions of the channel can be used to reduce the electric field at high drain bias with small increases in source and drain access resistance. Reduction of channel charge using a MIS gate extension (field plate) is now commonly used to increase the device performance at large drain bias. The charged dielectric approach described herein allows for the elimination of the field plate (and its associated parasitic capacitances) while maintaining state-of-the-art performance at drain biases up to 55 V for a device with a 0.2 micron gate length.

Figure 6:
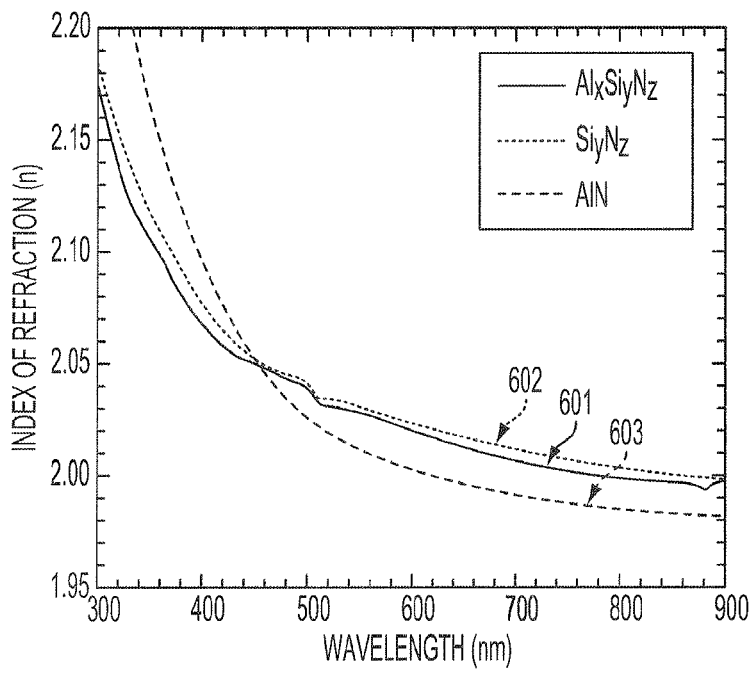
FIG. 6 shows a graph of Index of Refraction versus Wavelength for an aluminum-silicon nitride layer in comparison with a silicon nitride layer and an aluminum nitride layer

AlxSiyNz was explored as a passivation for AlGaN HEMTs due to its greater bandgap and its expected lower permittivity at microwave frequencies. The increase in bandgap is evidenced by its lower IR index of refraction when compared to SiyNz as measured by ellipsometry (i.e., see FIG. 6 where AlxSiyNz index of refraction 601 is interposed between SiyNz index of refraction 602 and AlN index of refraction 603).

AlxSiyNz and SiyNz films were deposited in a modified low-pressure chemical vapor deposition (LPCVD) system onto mesa-isolated AlGaN/GaN HEMT structures with 250 Å Al0.30Ga0.70N barriers grown on semi-insulating SiC. Dielectric deposition was performed at 750° C. at a pressure of 2 Torr with Trimethlyaluminum, Dichlorosilane, and Ammonia as precursors. The Aluminum fraction of the deposited dielectric was measured to be ~12 at. % by X-Ray Photoelectron Spectroscopy. SiyNz passivated structures had a full channel charge of ~1.6×1013 cm-2 with a corresponding sheet resistance of ~450 ohms/square. Ta/Ti/Al/Mo/Au source/drain, and Ni/Au gate contacts were placed in etched windows through the dielectric using CF4, and SF6/BCl3/Ar RIE etches, respectively, defined by electron beam lithography.

Figure 7:
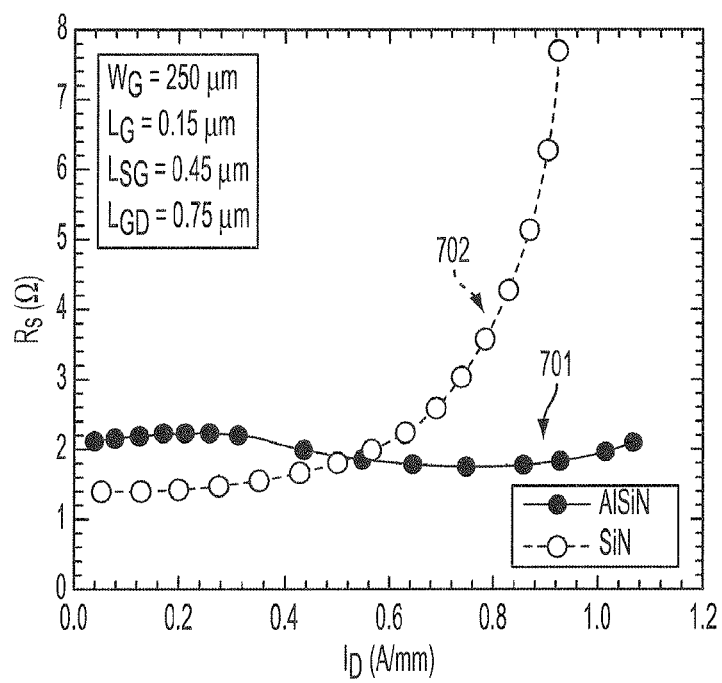
FIG. 7 shows a graph of Source Resistance versus Drain Current for a high electron mobility transistor passivated with an aluminum-silicon nitride layer in accordance with an embodiment of the invention, in comparison with a high electron mobility transistor passivated with a silicon nitride layer.

DC and small-signal RF measurements were performed on dual-gate "U" configured devices with gate lengths ranging from 0.075 to 0.25 microns using coplanar waveguide probes contacting Ti/Au probe pads. The pinch off voltage for the SiyNz, and AlxSiyNz devices was −2.5 V and −1.5 V respectively, indicating that the barrier layers were recessed by the gate window etch. Both dielectrics yielded nominal reverse gate current on the order of 10 µA/mm at drain biases up to ~30 V, above which the gate current of the AlxSiyNz devices was lower than the SiyNz devices. The fT was optimized at a gate length of 75 nm, and fmax optimized at gate lengths of 200 nm, with maximum extrinsic values of 87 GHz and 150 GHz, respectively. The AlxSiyNz coated devices consistently had roughly 10% higher values of these device bandwidth metrics for the same gate footprint due to the reduction of key parasitic capacitances from a lower permittivity. The extracted source-gate resistance showed a large nonlinear dependence on drain current for the SiyNz passivated devices. This effect is attributed to large longitudinal electric fields existing between the source-gate region. AlxSiyNz devices, with reduced channel charge in the ungated regions show a source resistance nearly independent with drain current (i.e., see FIG. 7, where reference numeral 701 corresponds with AlxSiyNz data and reference numeral 702 corresponds with SiyNz data).

Figure 8:
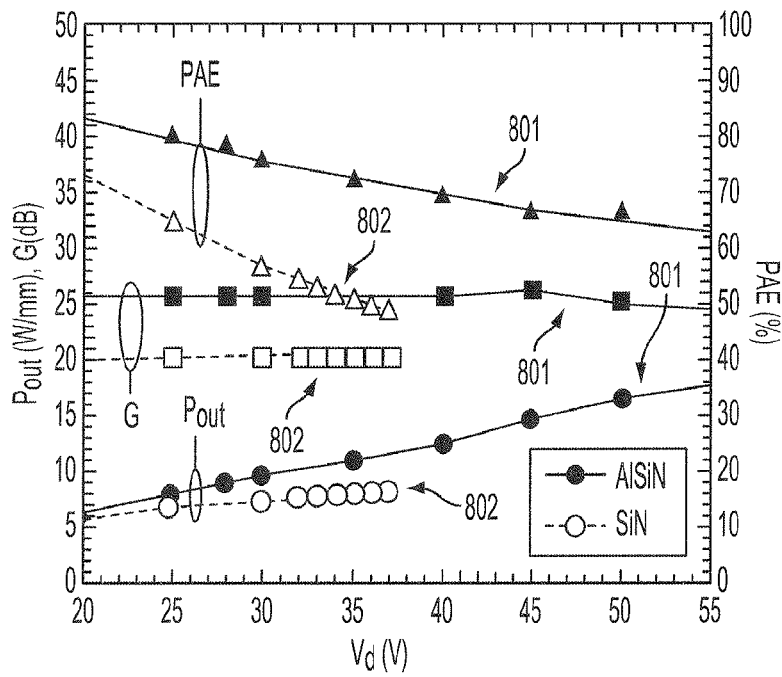
FIG. 8 shows a graph summarizing 10 GHz load pull characteristics for a high electron mobility transistor passivated with an aluminum-silicon nitride layer in accordance with an embodiment of the invention, in comparison with a high electron mobility transistor passivated with a silicon nitride layer.
Figure 9:
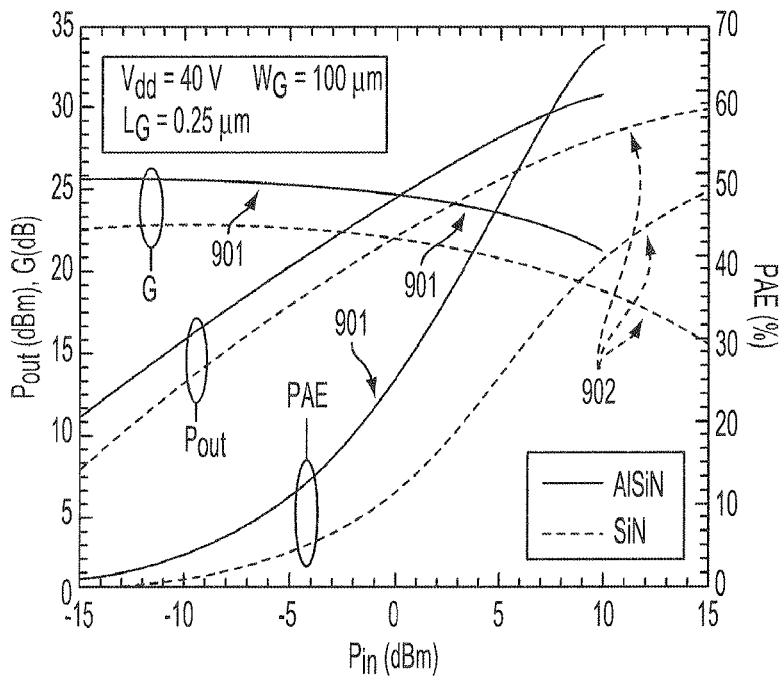
FIG. 9 shows a graph summarizing 10 GHz power sweep characteristics for a high electron mobility transistor passivated with an aluminum-silicon nitride layer in accordance with an embodiment of the invention, in comparison with a high electron mobility transistor passivated with a silicon nitride layer.

Large signal measurements were performed at 10 and 35 GHz. At 10 GHz, a series of power sweeps (optimized for PAE) was performed with drain biases ranging from 20 to 55 V (i.e., see FIG. 8 where reference numeral 801 corresponds with AlxSiyNz data and reference numeral 802 corresponds with SiyNz data). Maximum PAE measured 82% with 20 V on the drain, indicating that class-C operation was achieved on the harmonic load-pull bench used. At 40 V on the drain (beyond which the SiyNz devices failed) the AlxSiyNz and SiyNz devices yielded PAEs of 68% and 48% and output powers of 12.7 W/mm and 7.9 W/mm respectively (see FIG. 9, where reference numeral 901 corresponds with AlxSiyNz data and reference numeral 902 corresponds with SiyNz data). At 55 V on the drain the SiyNz devices failed while the AlxSiyNz passivated devices yielded a PAE of 61% and a power density of 17.6 W/mm which represents the highest performance values reported at 10 GHz for AlGaN/GaN HEMTs.

Figure 10:
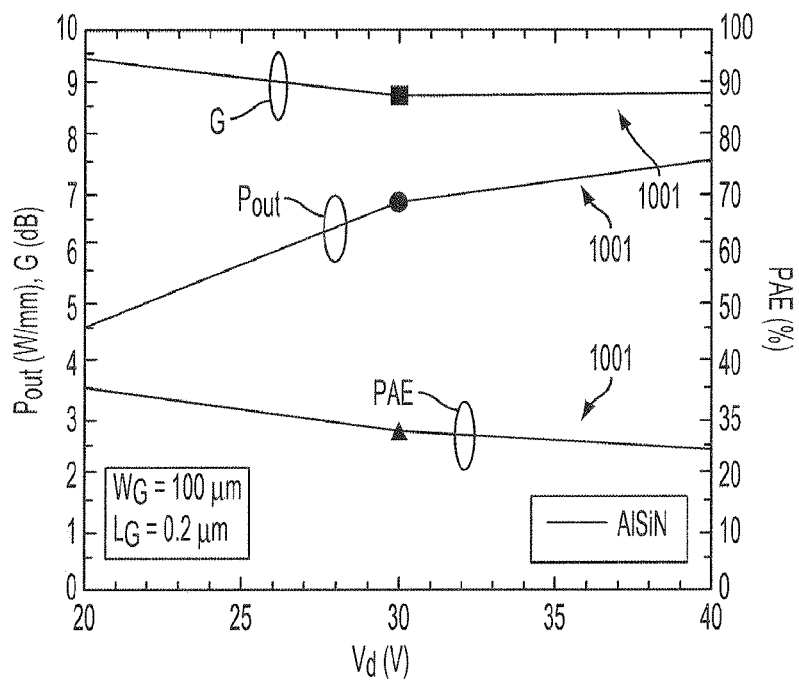
FIG. 10 shows a graph summarizing 35 GHz load pull characteristics for a high electron mobility transistor passivated with an aluminum-silicon nitride layer in accordance with an embodiment of the invention.
Figure 11:
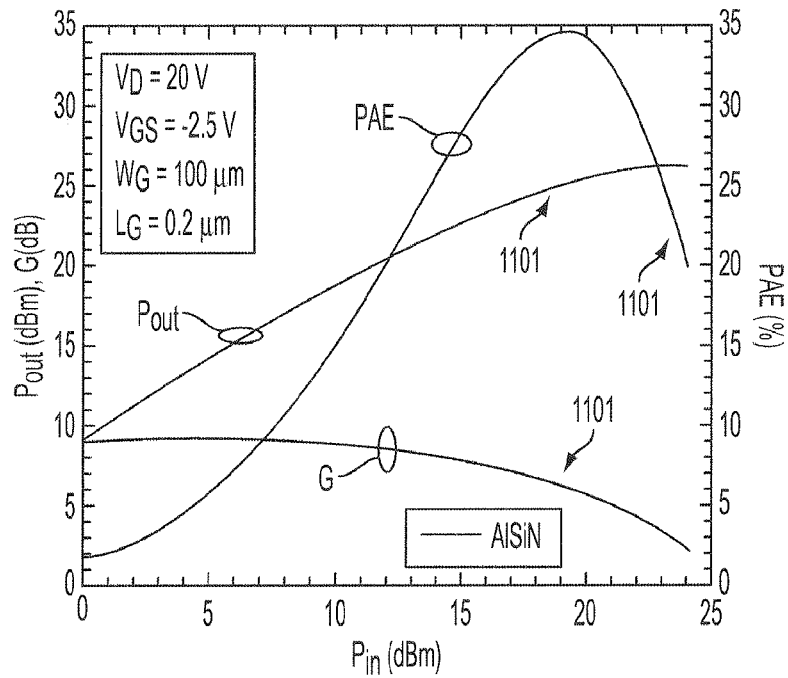
FIG. 11 shows a graph summarizing 35 GHz power sweep characteristics for a high electron mobility transistor passivated with an aluminum-silicon nitride layer in accordance with an embodiment of the invention.

At 35 GHz the AlxSiyNz devices were tested and the corresponding results illustrated in FIG. 10 (see reference numeral 1001 for the AlxSiyNz data) and FIG. 11 (see reference numeral 1101 for the AlxSiyNz data). The experiments were matched for output power and power sweeps were performed with drain biases ranging from 20 to 40 V. The devices had a maximum PAE of 35% at a drain bias of 20 V and a maximum output power density of 7.6 W/mm at a drain bias of 40 V.

The preferred embodiments and experimental data in accordance with the invention are illustrative of the invention rather than limiting off the invention. Revisions and modifications may be made to semiconductor structures and methods in accordance with the preferred embodiments while still providing an embodiment in accordance with the invention, further in accordance with the accompanying claims.

What is claimed is:

1. A semiconductor structure comprising:
   a semiconductor layer located over a substrate: and
   a passivation layer located upon at least a portion of the semiconductor layer, wherein the passivation layer comprises a passivation material having a bandgap from about 4.5 to about 6 eV and a permittivity from about $6\times10^{-11}$ F/m to about $8\times10^{-11}$ F/m at a frequency from about 1 to about 100 GHz, and wherein the passivation layer comprises an aluminum-silicon nitride material.

2. A semiconductor structure comprising:
   at least one III-V semiconductor layer located over a substrate; and
   a passivation layer located upon the III-V semiconductor layer, the passivation layer comprising an aluminum-silicon nitride material having a bandgap from about 4.5 to about 6 eV and a permittivity from about $6\times10^{-11}$ F/m to about $8\times10^{-11}$ F/m at a frequency from about 1 to about 100 GHz.

3. The semiconductor structure of claim 2 wherein the III-V semiconductor layer comprises a III-V semiconductor material selected from the group consisting of a group III nitride semiconductor material and a gallium arsenide semiconductor material.

4. The semiconductor structure of claim 2 wherein the III-V semiconductor layer comprises a III-V semiconductor material selected from the group consisting of gallium nitride based semiconductor materials, gallium arsenide based semiconductor materials, indium phosphide based semiconductor materials and gallium phosphide based semiconductor materials.

5. A high electron mobility transistor structure comprising:
   a buffer layer comprising a first group III nitride semiconductor material located over a substrate;
   a barrier layer comprising a second group III nitride semiconductor material located upon the buffer layer;
   a source contact and a drain contact located at least in-part contacting separated portions of the barrier layer;
   a first dielectric passivation layer located upon at least a portion of the barrier layer interposed between the source contact and the drain contact, the first dielectric passivation layer comprising an aluminum-silicon nitride material having a bandgap from about 4.5 to about 6 eV and a permittivity from about $6\times10^{-11}$ F/m to about $8\times10^{-11}$ F/m at a frequency from about 1 to about 100 GHz; and
   a gate located interposed between the source contact and the drain contact, and contacting the barrier layer.

6. The high electron mobility transistor of claim 5 wherein the substrate comprises a material selected from the group consisting of silicon, silicon carbide, sapphire, gallium nitride, aluminum nitride, germanium, gallium arsenide, gallium phosphide, and indium phosphide materials.

7. The high electron mobility transistor of claim 5 further comprising a two-dimensional electron gas located at the interface of the buffer layer and the barrier layer.

8. The high electron mobility transistor of claim 5 wherein the gate comprises a recessed gate that penetrates through at least a portion of the barrier layer.

9. The high electron mobility transistor of claim 8 further comprising a second dielectric passivation layer comprising a silicon nitride material located upon a portion of the barrier layer not covered by the first dielectric passivation layer, the first dielectric passivation layer serving as a gate extension that extends only a portion of a distance from the gate towards at least one of the source contact and the drain contact.

10. The high electron mobility transistor of claim 9 wherein the second dielectric passivation layer further extends above the first dielectric passivation layer gate extension.

11. The high electron mobility transistor of claim 8 wherein the recessed gate is selected from the group consisting of a Schottky type gate and a metal-insulator-semiconductor (MIS) type gate.

12. The high electron mobility transistor of claim 8 wherein the recessed gate includes both Schottky type gate characteristics and metal-insulator-semiconductor type gate characteristics.

13. The high electron mobility transistor of claim 8 wherein the first dielectric passivation layer is planar.

14. A metal semiconductor field effect transistor structure comprising:
   an undoped gallium arsenide buffer layer located over a substrate;
   a conducting gallium arsenide layer located upon the undoped gallium arsenide layer;
   a source contact and a drain contact located upon separated portions of the conducting gallium arsenide layer;
   a first dielectric passivation layer located upon at least a portion of the conducting gallium arsenide layer and interposed between the source contact and the drain contact, the first dielectric passivation material comprising an aluminum-silicon nitride material having a bandgap from about 4.5 to about 6 eV and a permittivity from about $6\times10^{-11}$ F/m to about $8\times10^{-11}$ F/m at a frequency from about 1 to about 100 GHz; and
   a gate located interposed between the source contact and the drain contact, and contacting the conducting gallium arsenide layer.

15. The metal semiconductor field effect transistor of claim 14 wherein the gate comprises a recessed gate located interposed between the source contact and the drain contact, and extending through the first dielectric passivation layer and through at least a portion of the conducting gallium arsenide layer.

16. The metal semiconductor field effect transistor of claim 14 further comprising a second dielectric passivation layer comprising a silicon nitride material located upon a portion of the conducting gallium arsenide layer not covered by the first dielectric passivation layer, the first dielectric passivation layer serving as a gate extension that extends only a portion of a distance from the gate towards at least one of the source contact and the drain contact.

17. The metal semiconductor field effect transistor of claim 16 wherein the second dielectric passivation layer further extends above the first dielectric passivation layer gate extension.

18. The metal semiconductor field effect transistor of claim 15 wherein the recessed gate is a Schottky type gate.

19. A semiconductor structure comprising:
a semiconductor layer located over a substrate: and
a passivation layer located upon at least a portion of the semiconductor layer, wherein the passivation layer comprises a passivation material having a bandgap from about 4.5 to about 6 eV and a permittivity from about $6\times10^{-11}$ F/m to about $8\times10^{-11}$ F/m at a frequency from about 1 to about 100 GHz, wherein the passivation layer comprises an aluminum-silicon nitride material that has:
an aluminum content from about 0.1 to about 25 atomic percent;
a silicon content from about 25 to about 55 atomic percent; and
a nitrogen content from about 40 to about 60 atomic percent.

20. The semiconductor structure of claim 2 wherein the aluminum-silicon nitride material has:
an aluminum content from about 0.1 to about 25 atomic percent;
a silicon content from about 25 to about 55 atomic percent; and
a nitrogen content from about 40 to about 60 atomic percent.

21. The high electron mobility transistor structure of claim 5 wherein the aluminum-silicon nitride material has:
an aluminum content from about 0.1 to about 25 atomic percent;
a silicon content from about 25 to about 55 atomic percent; and
a nitrogen content from about 40 to about 60 atomic percent.

22. The metal semiconductor field effect transistor structure of claim 14 wherein the aluminum-silicon nitride material has:
an aluminum content from about 0.1 to about 25 atomic percent;
a silicon content from about 25 to about 55 atomic percent; and
a nitrogen content from about 40 to about 60 atomic percent.

* * * * *